(12) United States Patent
Gabele et al.

(10) Patent No.: US 6,360,350 B1
(45) Date of Patent: *Mar. 19, 2002

(54) METHOD AND SYSTEM FOR PERFORMING CIRCUIT ANALYSIS ON AN INTEGRATED-CIRCUIT DESIGN HAVING DESIGN DATA AVAILABLE IN DIFFERENT FORMS

(75) Inventors: Carol Ivash Gabele; Stephen Thomas Quay, both of Austin; Paul Gerard Villarrubia, Round Rock; Parsotam Trikam Patel, Austin, all of TX (US); Jean-Paul Watson, Loveland, CO (US)

(73) Assignee: International Business Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/944,975

(22) Filed: Oct. 7, 1997

(51) Int. Cl.⁷ .............................................. G06F 17/50
(52) U.S. Cl. .............................................. 716/1; 716/5
(58) Field of Search .................... 395/500.02, 500.03, 395/500.06, 500.07; 716/1, 2, 5, 6

(56) References Cited

U.S. PATENT DOCUMENTS

| | | | |
|---|---|---|---|
| 4,931,722 A | 6/1990 | Stoica | 371/22.5 |
| 5,168,455 A | 12/1992 | Hooper | |
| 5,487,018 A | 1/1996 | Loos et al. | |
| 5,495,419 A | 2/1996 | Rostoker et al. | 364/468 |
| 5,541,849 A | 7/1996 | Rostoker et al. | |
| 5,544,066 A | 8/1996 | Rostoker et al. | |
| 5,610,832 A * | 3/1997 | Wikle et al. | 364/491 |
| 5,831,869 A * | 11/1998 | Ellis et al. | 364/490 |
| 5,883,808 A * | 3/1999 | Kawarabayashi | 395/500.06 |
| 5,896,300 A * | 4/1999 | Raghavan et al. | 395/500.09 |
| 5,903,469 A * | 5/1999 | Ho | 395/500.03 |
| 5,910,899 A * | 6/1999 | Barrientos | 395/500.09 |
| 5,912,820 A * | 6/1999 | Kerzman | 364/489 |

OTHER PUBLICATIONS

Ramachandran et al. "Combined Topological and Functionality–Based Delay Estimation Using a Layout–Driven Approach for High–Level Applications," IEEE, pp. 1450–1460, Dec. 1994.*

Chou et al "3–D Extraction Techniques for Signal Integrated Analysis," IEEE, May 1995, pp. 379–382.*

Gaston et al "Efficient Extraction of Metal Parasitic Capacitances," IEEE, Mar. 1995, pp. 157–160.*

* cited by examiner

Primary Examiner—Matthew Smith
Assistant Examiner—Vuthe Siek
(74) Attorney, Agent, or Firm—Anthony V. S. England; Robert M. Carwell; Bracewell & Patterson, L.L.P.

(57) ABSTRACT

A method for performing circuit analysis on an integrated-circuit design having design data available in different forms is disclosed. In accordance with the method and system of the present invention, the integrated-circuit design includes multiple networks, and the different forms of design data may appear within one of the networks. For all of the networks within the integrated-circuit design, different forms of design data are categorized into at least three databases. The first of the at least three databases may contain three-dimensional extraction information, the second of the databases may contain wiring information, and the third of the databases may contain pre-wiring information. For each of the networks, a determination is made as to whether or not three-dimensional extraction information is available. In response to a determination that three-dimensional extraction information is available, performing circuit analysis by utilizing the three-dimensional extraction information.

12 Claims, 8 Drawing Sheets

METHOD AND SYSTEM FOR PERFORMING CIRCUIT ANALYSIS ON AN INTEGRATED-CIRCUIT DESIGN HAVING DESIGN DATA AVAILABLE IN DIFFERENT FORMS

BACKGROUND OF THE INVENTION

1. Technical Field

The present invention relates to an improved method and system for data processing in general and, in particular, to an improved method and system for processing data related to an integrated circuit design. Still more particularly, the present invention relates to a method and system for performing circuit analysis on an integrated-circuit design having design data available in different forms according to design stages.

2. Description of the Prior Art

A microelectronic integrated-circuit (IC) comprises a large number of electronic components that are fabricated by layering several different materials on a silicon wafer. The process of converting an electrical circuit specification into a geometric description known as layout is called physical design. Physical design is an extremely tedious and error-prone process because of the tight tolerance requirements and the minuteness of the individual electronic components. The layout is then checked to ensure that the IC design it represents meets all of the design requirements. The result is a set of design files with data stored under a particular format that describes the layout.

The design files are subsequently converted into pattern generator files that are utilized to produce patterns known as masks via an optical or electron beam pattern generator. During fabrication, these masks are utilized to pattern a silicon wafer under a sequence of photolithographic steps.

Due to the large number of electronic components and the exacting details required by the fabrication process, physical design is not practical without the aid of computers. As a result, most stages of a physical design utilize Computer-Aided Design (CAD) tools extensively, and many stages have already been partially or fully automated. These stages include Partitioning, Floor Planning, Placement, and Routing.

Partitioning—A chip may contain several million transistors. Layout of the entire circuit cannot be handled due to the limitation of memory space as well as the computation power available. Therefore, it is normally partitioned by grouping the electronic components into blocks such as sub-circuits and modules. The actual partitioning process considers many factors such as the size of the blocks, number of blocks, and number of interconnections between the blocks.

In large circuits, the partitioning process is often hierarchical, although non-hierarchical processes can also be utilized. The output of partitioning is a set of blocks, along with the interconnections required between blocks. The set of interconnections required is referred to as a netlist.

Floor Planning and Placement—Floor Planning is concerned with selecting good layout alternatives for each block of the entire chip, as well as between blocks and at the edges. Floor Planning is a critical step as it sets up the ground work for a good layout.

During Placement, the blocks are positioned exactly on the chip. The goal of placement is to find a minimum-area arrangement for the blocks that allows completion of interconnections between the blocks. Placement is typically done in two phases. In the first phase, an initial placement is created. In the second phase, the initial placement is evaluated, and iterative improvements are made until the layout has minimum area and conforms to design specifications.

Routing—The objective of routing is to complete is the interconnections between blocks according to the specified netlist. First, the space not occupied by blocks, which is called the routing space, is partitioned into rectangular regions called channels and switch boxes. The goal of a router is to complete all circuit connections by utilizing the shortest possible wire length and the channel and switch boxes only.

Routing is usually done in two phases referred to as the global-routing and detailed-routing phases. In global routing, connections are completed between the proper blocks of the circuit, disregarding the exact geometric details of each wire and terminal. For each wire, a global router finds a list of channels that are to be utilized as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes channel routing and switch box routing.

During a design process, checking tools are a key part of the design tool set, as they allow for IC designers to verify their work. These checking tools have many different functions, such as capacitance calculation and resistance-capacitance (RC delay) estimation. However, it has always been a problem for these checking tools to provide support throughout all the different development stages mentioned above. This is because in the early stages of a design, not much is known about the layout. Only as the design progresses, more is known about rough layout, and finally, there is wiring data available.

Nevertheless, IC designers need to perform timing analysis in early design stage to ensure that the target clock speed will be obtained. Hence, timing analysis has to be performed as early as possible in the design process. Because design data is available in different forms at the early stage of the design process, each according to a specific stage of the design process, therefore it has been a problem in the past for the IC designer to perform circuit analysis in the beginning or at the middle of the design process. Not only is the design in different data formats at different stages, but the various sections of a design may be at different levels, also. For example, a functional unit, such as random-logic macros, may be designed and wired, but no global wiring may have been completed; or even within one network, part of the circuit may be wired while another part may not be.

Consequently, it would be desirable to provide a method to perform circuit analysis on an integrated-circuit design having design data available in different forms according to design stages, even within one network.

SUMMARY OF THE INVENTION

In view of the foregoing, it is one object of the present invention to provide an improved method and system for data processing.

It is another object of the present invention to provide an improved method and system for processing data related to an integrated circuit design.

It is yet another object of the present invention to provide an improved method and system for performing circuit analysis on an integrated-circuit design having design data available in different forms according to design stages.

In accordance with the method and system of the present invention, the integrated-circuit design includes multiple networks, and the different forms of design data may appear within one of the networks. For all of the networks within the integrated-circuit design, different forms of design data are categorized into at least three databases. The first of the at least three databases may contain three-dimensional extraction information, the second of the data-bases may contain wiring information, and the third of the databases may contain pre-wiring information. For each of the networks, a determination is made as to whether or not three-dimensional extraction information is available. In response to a determination that three-dimensional extraction information is available, performing circuit analysis by utilizing the three-dimensional extraction information.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention may be executed in a midrange computer or in a mainframe computer under a number of different operating systems. In addition, the computer may be a stand-alone system or part of a network such as a local-area network (LAN) or a wide-area network (WAN). For the purpose of illustration, a preferred embodiment of the present invention, as described below, is implemented on an RS/6000™ computer, manufactured by International Business Machines Corporation.

Figure 1:
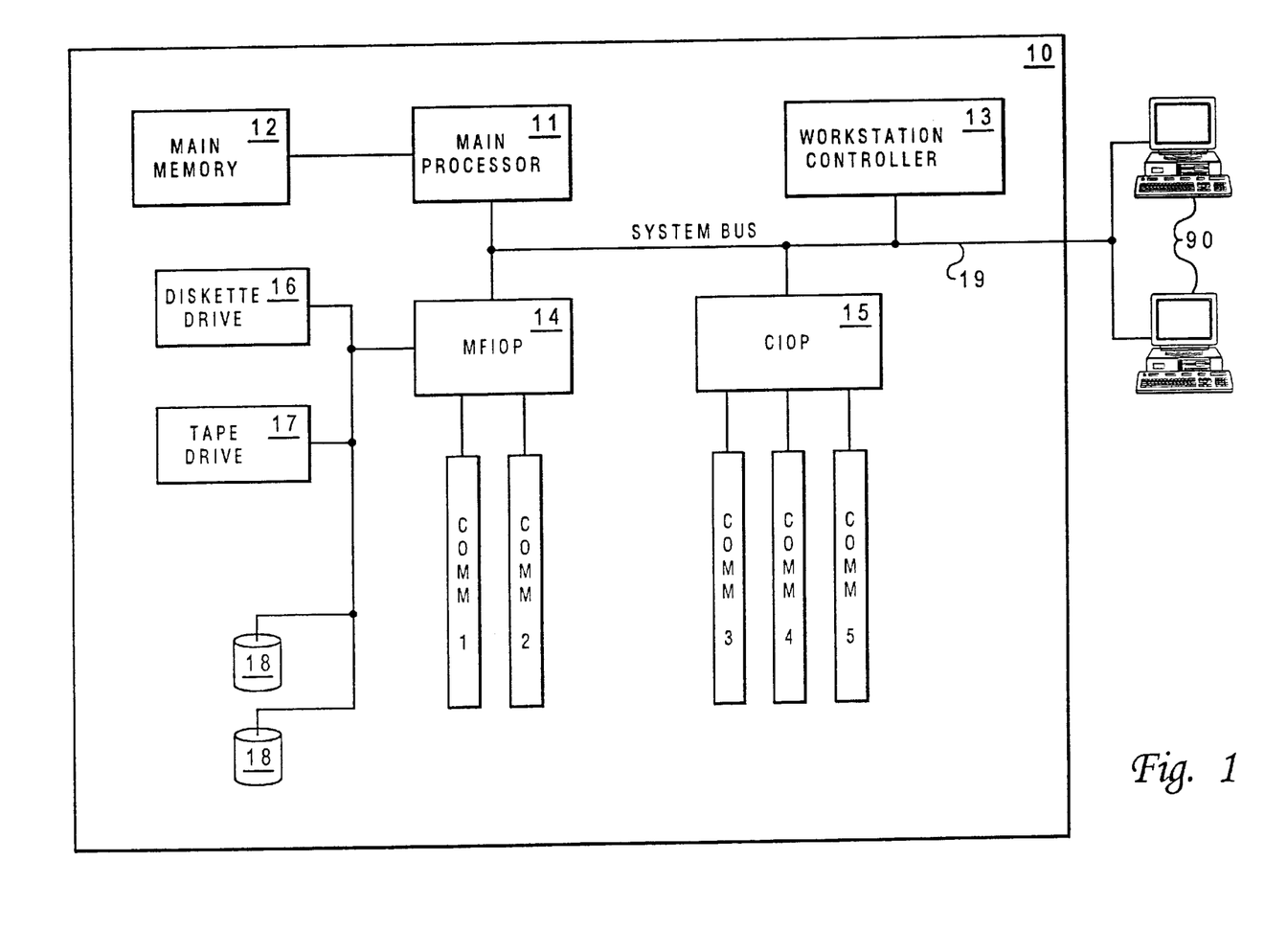
FIG. 1 is a block diagram of a computer system that may be utilized by a preferred embodiment of the invention.

Referring now to the drawings and, in particular, to FIG. 1, there is illustrated a block diagram of a computer system that may be utilized by a preferred embodiment of the invention. Within computer box 10, main processor 11 is coupled to a main memory 12 and a multiple-function I/O processor (MFIOP) 14. Main processor 11 may include a single processor or multiple processors. Several peripheral storage devices such as diskette drive 16, tape drive 17, and direct access storage devices (DASDs) 18, are controlled by MFIOP 14. In addition, MFIOP 14 provides communications to other devices via communication ports such as COMM 1 and COMM 2.

Attached to system bus 19 are a workstation controller 13 and a communications I/O processor (CIOP) 15. Workstation controller 13 provides communications between main processor 11 and workstation(s) 90 that may be connected to the computer system. CIOP 15 provides communications to other devices via communication ports such as COMM3, COMM4, and COMM5.

Figure 2:
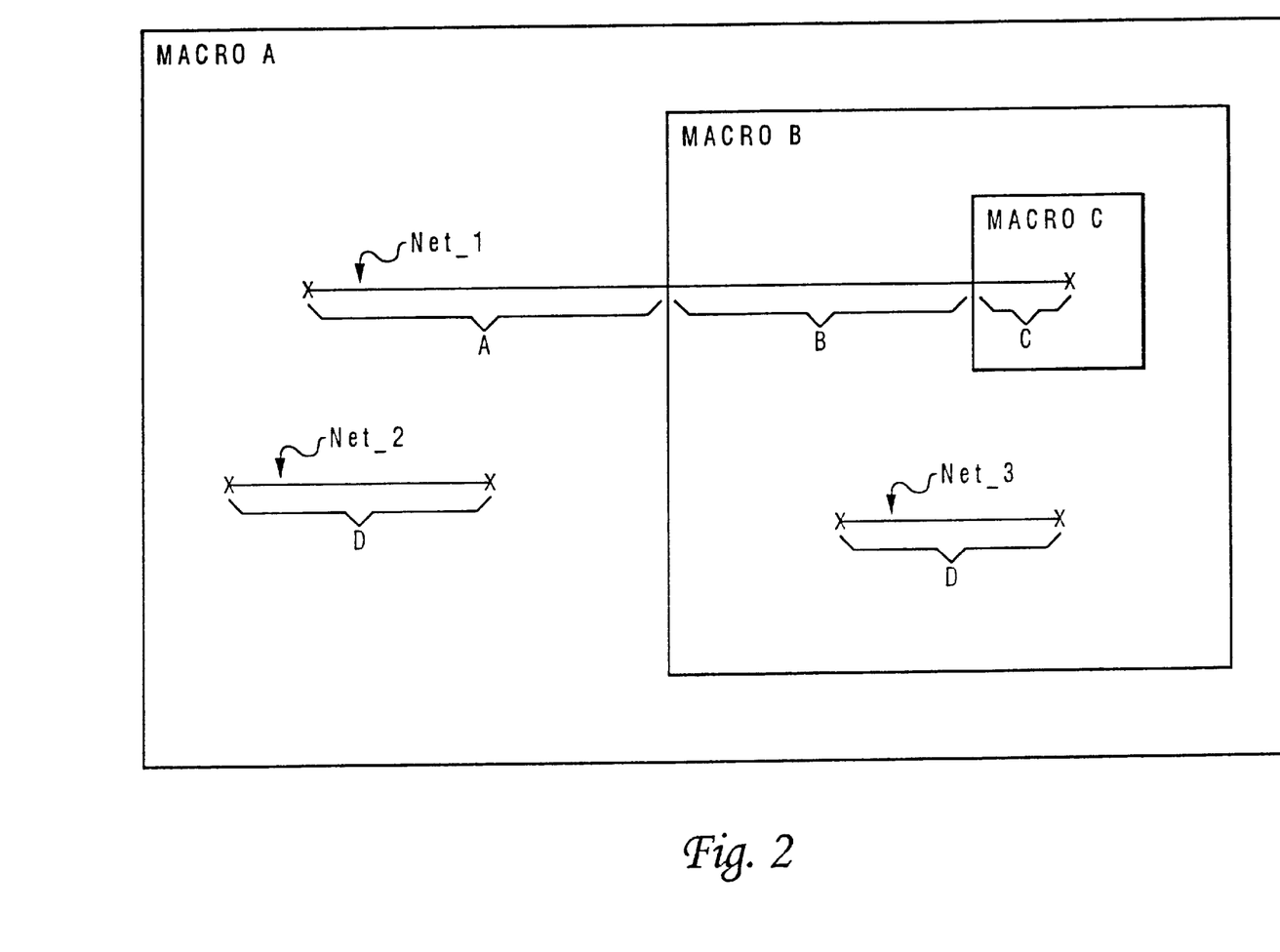
FIG. 2 is a block diagram illustrating an example of a hierarchial view of networks.

With reference now to FIG. 2, there is depicted a block diagram illustrating an example of a hierarchial view of several macros and networks. Under a preferred embodiment of the present invention, the three hierarchical nets, namely, Net_1, Net_2, and Net_3, must be categorized before the proper analysis can be performed. Segments A, B, C and D are referred to as net segments. As shown, segment A of Net_1 is categorized as "non-hierarchical and incomplete;" segment B of Net_1 is categorized as "hierarchical and incomplete;" and, segment C of Net_1 is categorized as "hierarchical and complete." Net_2 and Net_3 (or segments D), although belonging to different macros, are nets wholly contained at that level of the hierarchy. Such nets are categorized as "not hierarchical and complete," because they are not extending into a higher level of the hierarchy and they do not descend into a lower level of the hierarchy.

Figure 3:
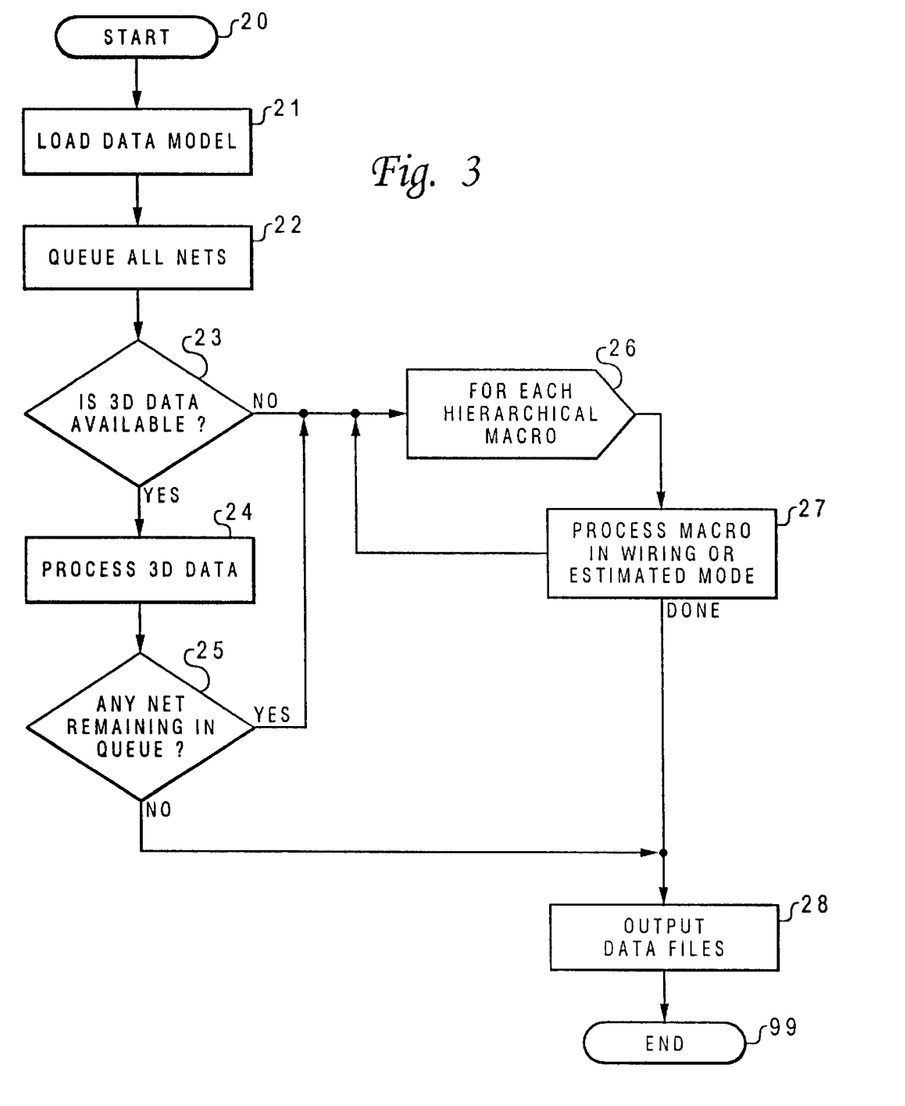
FIG. 3 is a high-level logic flow diagram of a method for performing circuit analysis on an integrated-circuit design having design data available in different forms according to design stages, in accordance with a preferred embodiment of the present invention.

Referring now to FIG. 3, there is illustrated a high-level logic flow diagram of a method for performing circuit analysis on an integrated-circuit design having design data available in different forms according to design stages, in accordance with a preferred embodiment of the present invention. Starting at block 20, all design data are loaded from their respective database, as shown in block 21. As a preferred embodiment of the present invention, a physical design includes at least three types of databases. The first type of database contains design data from the beginning of the design process up to the beginning of the wiring stage. The second type of database contains design data including the wiring stage. The third type of database contains design data from a three-dimensional (3-D) extraction of the coupling capacitors between layout components of the physical design. Each network of the design is then put into a queue, as depicted in block 22.

A determination is then made as to whether or not 3-D data is available in each network within the queue, as illustrated in block 23. If 3-D data is available, the 3-D data will be processed accordingly, as shown in block 24. Another determination is then made as to whether there is any network remaining in the queue, as depicted in block 25. If there is no network remaining in the queue, then the process proceeds to block 28, otherwise, if there is a network remaining in the queue, then the process proceeds to block 26.

For a network that does not have any 3-D data available, each hierarchical macro within the network is then processed under a wiring mode or an estimated mode, as illustrated in block 27. The wiring mode is for data from the second type of database while the estimated mode is for data from the first type of database. Finally, the data files are output, as shown in block 28, and the process exits at block 99.

Figure 4:
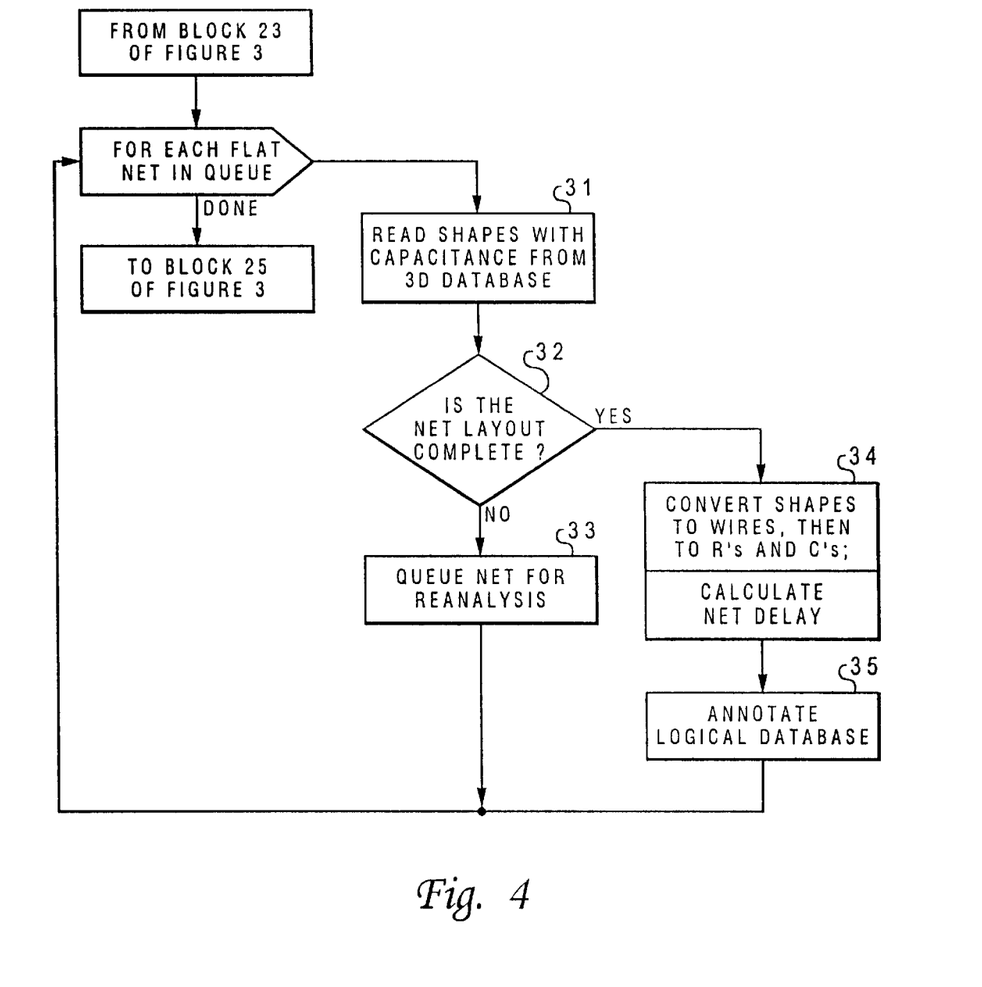
FIG. 4 is a high-level logic flow diagram illustrating the step of processing 3-D data (block 24) as shown in FIG. 3.

With reference now to FIG. 4, there is depicted a high-level logic flow diagram illustrating the step of processing 3-D data (block 24) as shown in FIG. 3. For each network within the queue, a shape with a list of coupling capacitances is read from the 3-D database (third type of database), as shown in block 31. A determination is then made as to whether or not the wiring within the network is complete, as depicted in block 32. If the network wiring is not complete, the network is put back into the queue for reanalysis, as illustrated in block 33. However, if the 30 network wiring is complete, the shape of the network is converted to wires, then translated to resistances and capacitances, and finally, then the network capacitance and the RC delay are calculated, as shown in block 34. Subsequently, the logical database is annotated, as depicted in block 35.

Figure 5:
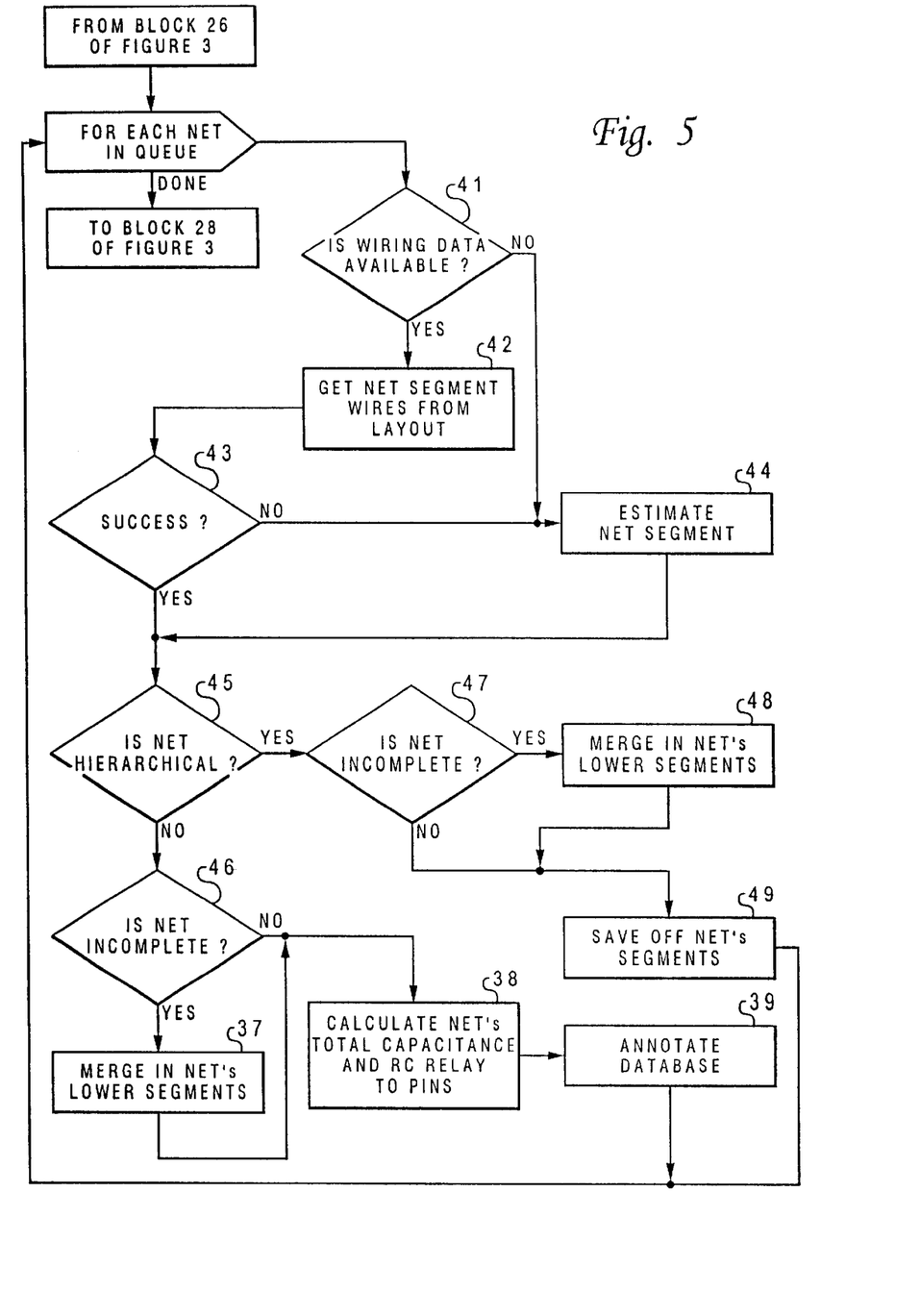
FIG. 5 is a high-level logic flow diagram illustrating the step of processing macros in wiring mode or estimated mode (block 26) as shown in FIG. 3.

Referring now to FIG. 5, there is depicted a high-level logic flow diagram illustrating the step of processing macros in wiring mode or estimated mode (block 27) as shown in FIG. 2. For each network within the queue for a given macro, a determination is made as to whether or not wiring data is available, as shown in block 41. If wiring data is available, the net segment wires are obtained from the layout, as depicted in block 42. A determination is made as to whether or not a complete network is obtainable, as illustrated in block 43. If the network is not obtainable, the net segments will be estimated, as shown in block 44.

Another determination is made as to whether or not the network is hierarchical, as shown in block 45. If the network is hierarchical, another determination is made as to whether or not the network is incomplete, as depicted in block 47. If the network is incomplete, the network's lower segments are merged into the network, as shown in block 48. The network segments for this macro and any network segments contained in lower level macros are then saved, as depicted in block 49. Since the network is hierarchical, the capacitance and resistance calculation will not be performed until after the network has been completed by the higher level.

However, if the network is not hierarchical, another determination is made as to whether or not the network is complete, as shown in block 46. If the network is incomplete, the network's lower segments are merged into the network, as shown in block 37. Since the network is completed now, the total capacitance and the RC delay of the network is then calculated, as depicted in block 38. Finally, the database is annotated, as shown in block 39.

Figure 6:
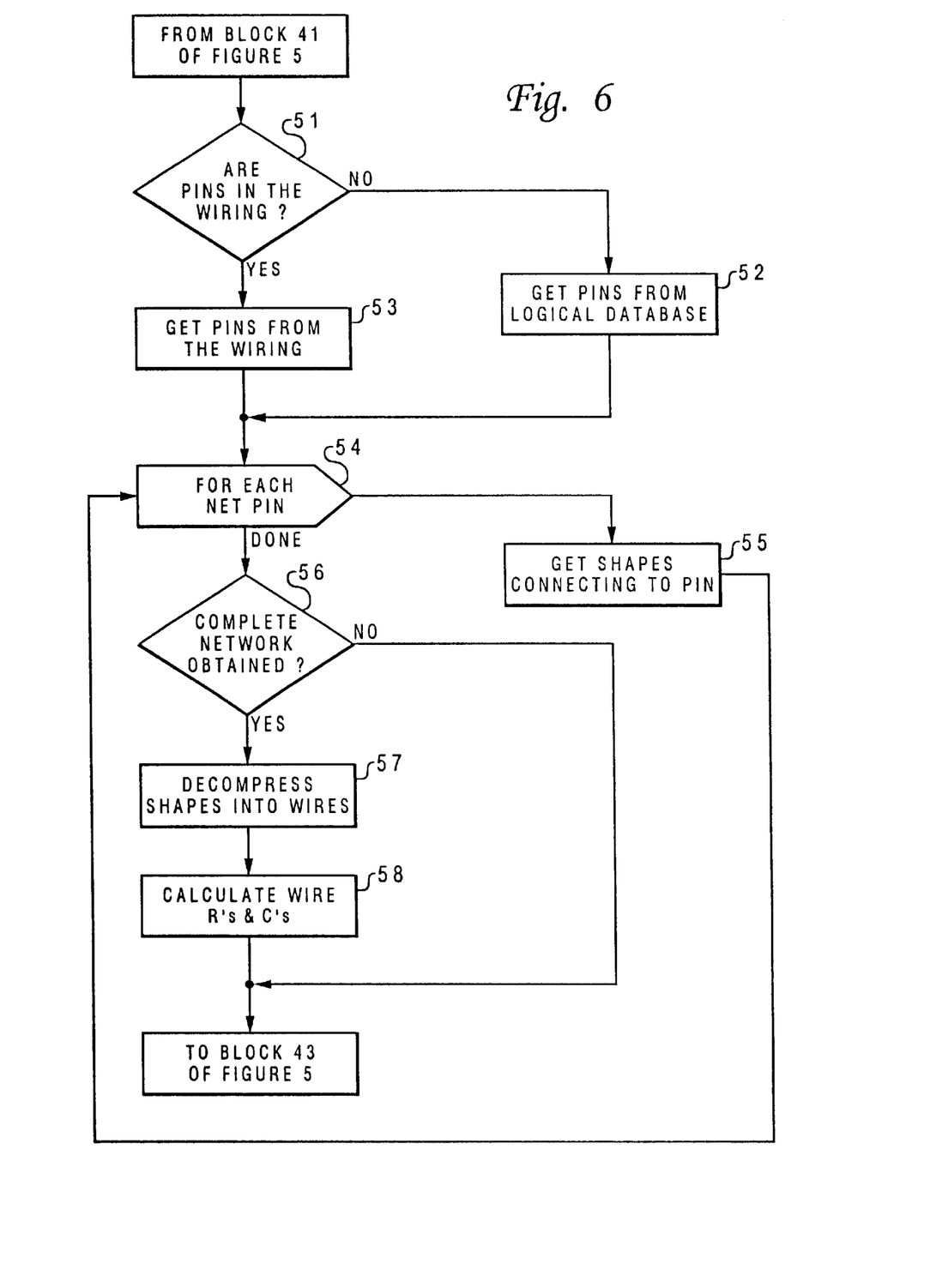
FIG. 6 is a high-level logic flow diagram illustrating the function (block 42) of FIG. 5, get net segment wires from layout.

With reference now to FIG. 6, there is depicted a high-level logic flow diagram illustrating the get net segment wires from layout (block 42) of FIG. 5. Starting at block 51, a determination is made as to whether or not there are pins in the wiring. If the layout of lower level hierarchical components is incomplete, the pins will be missing from the wiring. If there are no pins in the wiring, the pins are obtained from the logical database, as depicted in block 52, and the process proceeds to block 54. Otherwise, if there are pins in the wiring, the pins are obtained from the wiring, as illustrated in block 53.

For each network pin, the shapes connecting to the pins are obtained, as shown in block 55. This process is repeated for each network pin, as depicted in block 54. Then, a determination is made as to whether or not the complete network is obtained. If not, the process exits to block 43 of FIG. 5. If yes, all the obtained shapes are decomposed into wires information, as illustrated in block 57. The resistance and capacitance of these wires are calculated, as shown in block 58.

Figure 7:
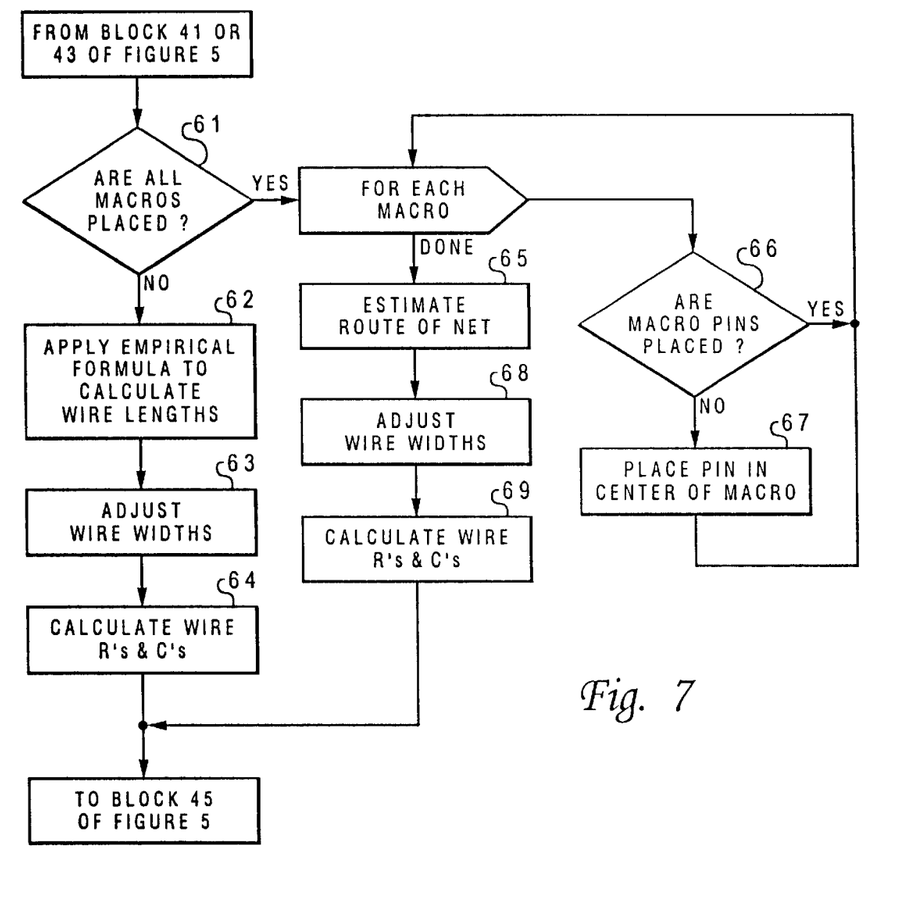
FIG. 7 is a high-level logic flow diagram illustrating estimation of net segment (block 44) of FIG. 5.

Referring now to FIG. 7, there is depicted a high-level logic flow diagram illustrating the estimation of a net segment (block 44) of FIG. 5. Starting at block 61, a determination is made as to whether or not all the child macros are placed. If all the macros are not placed, an empirical formula is applied to calculate wire lengths, as depicted in block 62. Wire widths are adjusted corresponding to specifications to the router on the wire's layout. Then, the wire widths are adjusted, as illustrated in block 63. The resistance and capacitance of wire are calculated, as shown in block 64, and the process exits to block 45 of FIG. 5.

Otherwise, if all the macros are placed, for each macro, a determination is made as to whether or not the macro pins are placed, as shown in block 66. If the macro pins are not placed, the pin is placed in the center of the macro, as depicted in block 67.

Thereafter, the route of the network is estimated, as shown in block 65. The wire widths are adjusted, as depicted in block 68. Finally, the resistance and the capacitance of the wires are calculated, as illustrated in block 70, and the process exits to block 45 of FIG. 5.

Figure 8:
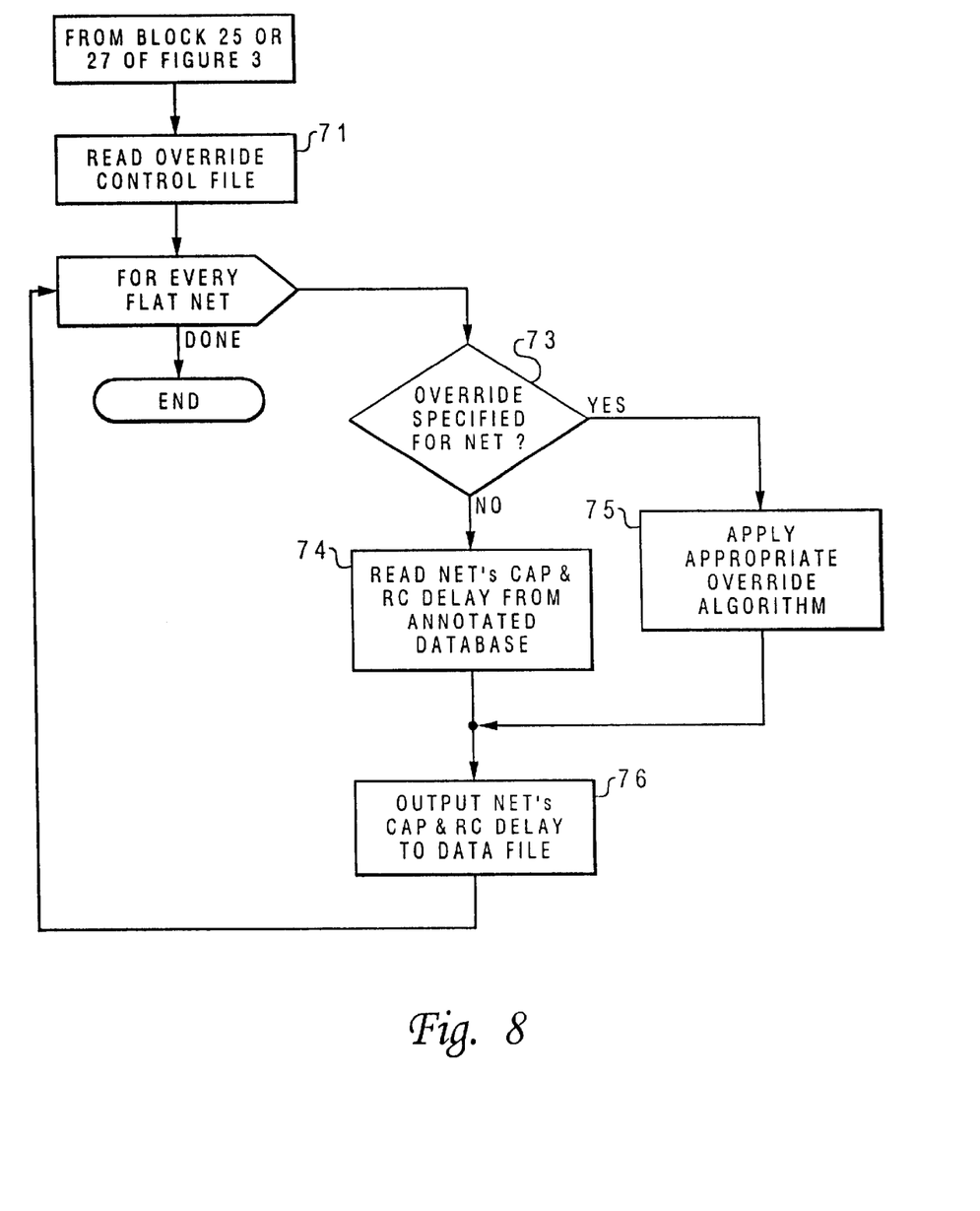
FIG. 8 is a high-level logic flow diagram illustrating the output of data files (block 27) of FIG. 3.

With reference now to FIG. 8, there is depicted a high-level logic flow diagram illustrating the output of data files (block 27) of FIG. 3. Starting at block 71, the override control file is read. Then for every flat net, a determination is made as to whether or not a user specified an override value for the net is specified, as depicted in block 73. For example, the user may want to override the calculation of a net's capacitance if the user knows that a very long wire will be broken into smaller pieces in later design stages. If the override is specified for a net, then an appropriate override algorithm is applied, as illustrated in block 75, and the process proceeds to block 76. Otherwise, if the override is not specified for net, then the resistance and capacitance are read from annotated database, as shown in block 74. Finally, the resistance and capacitance of the net are output to a data file, as depicted in block 76.

As has been described, the present invention provides an improved method for performing circuit analysis on an integrated-circuit design having design data available in different forms according to design stages. The present invention also applies to design data available in different forms. even within one network, i.e., integration of design data down to sub-network level. Different forms of design data may include, but not limited to, data with no placement information, data with some or all placement information, data with placement and pin position information, data with pin position and wire shapes information, data with shapes information annotated with coupling capacitance, etc. For the purpose of illustration, these different forms of design data are grouped under three separate types of databases, as described above. However, it is understood that these different forms of design data may be grouped into any number of databases.

It is also important to note that, although the present invention has been described in the context of a fully functional computer system, those skilled in the art will appreciate that the mechanisms of the present invention are capable of being distributed as a program product in a variety of forms, and that the present invention applies equally regardless of the particular type of signal-bearing media utilized to actually carry out the distribution. Examples of signal-bearing media include but are not limited to recordable-type media, such as floppy disks or CD ROMs, and transmission-type media such as analogue or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for performing circuit analysis on an integrated circuit design having a plurality of networks, wherein each of said plurality of networks includes design data available in a format according to a design stage, said method comprising the steps of:

categorizing design data within said integrated circuit design into one of at least three categories according to said design data's format, wherein a first of said at least three categories contains only logical circuit information, a second of said at least three categories contains wiring information, and a third of said at least three categories contains three-dimensional extraction information;

performing a first circuit analysis on a network within said integrated circuit to design, in response to a determination that only logical circuit information is available within said network, utilizing said only logical circuit information within said first of said at least three categories;

performing a second circuit analysis on a network within said integrated circuit design, in response to a determination that wiring information is available within said network, utilizing said wiring information within said second of said at least three categories; and performing a third circuit analysis on a network within said integrated circuit design, in response to a determination that three-dimensional extraction information is available within said network, utilizing said three-dimensional extraction information within said third of said at least three categories, such that circuit analysis can be performed on said integrated circuit design at any given design stage;

and wherein said first circuit analysis step further includes a step of estimating a wire route utilizing said logical design information, a step of calculating wire capacitance by utilizing s aid estimated wire route, and a step of estimating total parasitic capacitance of said network by utilizing said calculated wire capacitance.

2. The method according to claim 1, wherein said third circuit analysis step further includes a step of calculating total parasitic capacitance of said network utilizing said three-dimensional extraction information.

3. The method according to claim 1, wherein said second circuit analysis step further includes a step of calculating wire capacitance by utilizing said wiring information and a step of estimating total parasitic capacitance of said network by utilizing said calculated wire capacitance.

4. The method according to claim 1, wherein said three categories are three databases.

5. A computer system for performing circuit analysis on an integrated circuit design having a plurality of networks, wherein each of said plurality of networks includes design data available in a format according to a design stage, said computer system comprising:

means for categorizing design data within said integrated circuit design into one of at least three categories according to said design data's format, wherein a first of said at least three categories contains only logical circuit information, a second of said at least three categories contains wiring information, and a third of said at least three categories contains three-dimensional extraction information;

means for performing a first circuit analysis on a network within said integrated circuit design, in response to a determination that only logical circuit information is available within said network, utilizing said only logical circuit information within said first of said at least three categories;

means for performing a second circuit analysis on a network within said integrated circuit design, in response to a determination that wiring information is available within said network, utilizing said Wiring information within said second of said at least three categories; and means for performing a third circuit analysis on a network within said integrated circuit design, in response to a determination that three-dimensional extraction information is available within said network, utilizing said three-dimensional extraction information within said third of said at least three categories, such that circuit analysis can be performed on said integrated circuit design at any given design stage;

and wherein said means for performing first circuit analysis step further includes a means for estimating a wire route utilizing said logical design information, a means for calculating wire capacitance utilizing said estimated wire route, and a means for estimating total parasitic capacitance of said network by utilizing said calculated wire capacitance.

6. The computer system according to claim 5, wherein said means for performing a third circuit analysis further includes a means for calculating total parasitic capacitance of said network utilizing said three-dimensional extraction information.

7. The computer system according claim 5, wherein said means for performing a second circuit analysis further includes a means for calculating wire capacitance utilizing said wiring information and a means for estimating total parasitic capacitance of said network by utilizing said calculated wire capacitance.

8. The computer system according to claim 5, wherein said three categories are three databases.

9. A computer program product residing on a computer usable medium for performing circuit analysis on an integrated circuit design having a plurality of networks, wherein each of said plurality of networks includes design data available in a format according to a design stage, said computer program product comprising:

program code means for categorizing design data within said integrated circuit design into one of at least three categories according to said design data's format, wherein a first of said at least three categories contains only logical circuit information, a second of said at least three categories contains wiring information, and a third of said at least three categories contains three-dimensional extraction information;

program code means for performing a first circuit analysis on a network within said integrated circuit design, in response to a determination that only logical circuit information is available within said network, utilizing said only logical circuit information within said first of said at least three categories;

program code means for performing a second circuit analysis on a network within said integrated circuit design, in response to a determination that wiring information is available within said network, utilizing said wiring information within said second of said at least three categories; and program code means for performing a third circuit analysis on a network within said integrated circuit design, in response to a determination that three-dimensional extraction information is available within said network, utilizing said three-dimensional extraction information within said third of said at least three categories, such that circuit analysis can be performed on said integrated circuit design at any given design stage;

and wherein said program code means for performing first circuit analysis step further includes a program code means for estimating a wire route utilizing said logical design information, a program code means for calculating wire capacitance utilizing said estimated wire route, and a program code means for estimating total parasitic capacitance of said network by utilizing said calculated wire capacitance.

10. The computer program product according to claim 9, wherein said program code means for performing a third circuit analysis further includes a program code means for calculating total parasitic capacitance of said network utilizing said three-dimensional extraction information.

11. The computer program product according to claim 9, wherein said program code means for performing a second circuit analysis further includes a program code means for calculating wire capacitance utilizing said wiring information and a program code means for estimating total parasitic capacitance of said network by utilizing said calculated wire capacitance.

12. The computer program product according to claim 9, wherein said three categories are three databases.

* * * * *